US012757437B2

(12) United States Patent
Peake et al.

(10) Patent No.: US 12,757,437 B2
(45) Date of Patent: Oct. 6, 2026

(54) TRENCH-GATE SEMICONDUCTOR DEVICE WITH TRENCH INCLUDING BURIED SOURCE

(71) Applicant: NEXPERIA B.V., Nijmegen (NL)

(72) Inventors: Steven Peake, Nijmegen (NL); Phil Rutter, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 578 days.

(21) Appl. No.: 17/579,718

(22) Filed: Jan. 20, 2022

(65) Prior Publication Data

US 2022/0231162 A1 Jul. 21, 2022

(30) Foreign Application Priority Data

Jan. 20, 2021 (EP) .................................... 21152483

(51) Int. Cl.
*H10D 30/66* (2025.01)
*H10D 30/01* (2025.01)
*H10D 64/00* (2025.01)

(52) U.S. Cl.
CPC ....... *H10D 30/668* (2025.01); *H10D 30/0297* (2025.01); *H10D 64/117* (2025.01)

(58) Field of Classification Search
CPC ............... H01L 29/7813; H01L 29/407; H01L 29/66734
See application file for complete search history.

(56) References Cited

U.S. PATENT DOCUMENTS

2005/0242392 A1 11/2005 Pattanayak et al.
2011/0136309 A1 6/2011 Grivna et al.
2012/0276703 A1* 11/2012 Grivna ................ H01L 29/7811 438/270
2016/0020315 A1* 1/2016 Hirler .................. H01L 29/407 257/329
2020/0295149 A1* 9/2020 Padmanabhan ..... H01L 29/7828

OTHER PUBLICATIONS

Extended European Search Report and Written Opinion for corresponding European application EP 21152483.0, 10 pages, dated Jul. 8, 2021.

* cited by examiner

*Primary Examiner* — Norman D Richards
(74) *Attorney, Agent, or Firm* — Ruggiero McAllister & McMahon LLC

(57) ABSTRACT

A trench-gate semiconductor device and a manufacturing method thereof is provided. The device is provided with each unit cell including a first trench, and a second trench extending from a bottom of the first trench. The device includes a gate oxide layer arranged on a first side wall of the first trench, a second oxide layer arranged on a second side wall and bottom of the second trench, a first polysilicon region arranged inside the first trench, separated from the first side wall by the gate oxide layer, forming a gate of the unit cell. The device includes a second polysilicon region arranged inside the second trench, separated from the second side wall and bottom of the second trench by the second oxide layer, forming a buried source of the unit cell, and a third oxide layer arranged in between the first polysilicon region and the second polysilicon region.

17 Claims, 5 Drawing Sheets

TRENCH-GATE SEMICONDUCTOR DEVICE WITH TRENCH INCLUDING BURIED SOURCE

CROSS REFERENCE TO RELATED APPLICATION

This application claims the benefit under 35 U.S.C. § 119(a) of European Application No. 21152483.0 filed Jan. 20, 2021, the contents of which are incorporated by reference herein in their entirety.

BACKGROUND OF THE DISCLOSURE

1. Field of the Disclosure

The present disclosure relates to a trench-gate semiconductor device and a manufacturing method thereof.

2. Description of the Related Art

Trench technology for semiconductor devices, such as trench metal-oxide-semiconductor field-effect transistors (MOSFETs), is widely used in various types of electronic devices. In known trench-MOSFETs, a gate electrode of the MOSFET is buried in a trench etched in a semiconductor region to form a vertical structure, which enhances the channel density of the device.

A cross-sectional view of a portion of a known trench-MOSFET structure 20 is shown in FIG. 1. The known device comprises a polysilicon gate region 21 provided in a trench 22 arranged inside a silicon semiconductor region. As shown in FIG. 1, the semiconductor region comprises a substrate of a first charge type and an epitaxial layer 23 arranged on the substrate and also being of the first charge type. Inside epitaxial layer 23, a body region 25 of a second charge type and a source region 24 of a first charge type are formed by means of ion implantation. Hereinafter, the non-implanted region of epitaxial layer 23 will be referred to as drift region 23. Furthermore, on the bottom of the substrate, a drain terminal of the trench-MOSFET is provided.

Trench-MOSFET structure 20 comprises a first oxide layer 26A that forms a gate oxide of the trench-MOSFET and that separates polysilicon gate region 21 from body region 25. Polysilicon gate region 21 is electrically connected to a gate terminal (not shown). By controlling a charge or voltage on polysilicon gate region 21, a channel can be formed in body region 25 between source region 24 and drift region 23, thereby enabling a current flow from the drain terminal of the trench-MOSFET to a source terminal of the MOSFET, which is electrically connected to source region 24.

A reduced surface field (RESURF) structure can be used for the purpose of enhancing a breakdown voltage of the trench-MOSFET. Referring to FIG. 1, the RESURF structure is formed by a second oxide layer 26B arranged on a part of a side wall and bottom of trench 22 combined with a buried polysilicon source region 27 inside trench 22 and separated from the sidewall and bottom of trench 22 by second oxide layer 26B. Buried polysilicon source region 27 is arranged below polysilicon gate region 21 and is separated therefrom by a third oxide layer 26C. A charge or voltage at buried polysilicon source region 27 can be controlled to alter the electric field distribution inside the semiconductor device to thereby increase a critical drain-to-source voltage at which the device breaks down. For example, by biasing buried polysilicon source region 27 at zero Volts, the RESURF effect is obtained, spreading the drain potentials uniformly across the drift region 23 and thereby creating a rectangular electric field distribution. In addition, buried polysilicon source region 27 partially shields polysilicon gate region 21 from drain region 23, thereby reducing a gate-drain capacitance and, consequently, improving a switching performance of the device.

When including the RESURF structure, third oxide layer 26C is required to separate polysilicon gate region 21 and buried polysilicon source region 27. Third oxide layer 26C joins with first oxide layer 26A and second oxide layer 26B at an intersection region 28.

The manufacturing process of structure 20 as shown in FIG. 1 is described next. First, a mask layer, e.g. silicon nitride, is deposited and patterned on top of epitaxial layer 23. Using the mask layer, epitaxial layer 23 is etched to form trench 22. Typically, trench 22 extends through a substantial part of epitaxial layer 23. After etching, an oxide layer is deposited on the structure including trench 22 and the mask layer, followed by a deposition of polysilicon material in trench 22 and on the mask layer. The deposited oxide material and polysilicon material are etched to a first depth inside trench 22 such that the remaining deposited oxide material defines second oxide layer 26B and the remaining deposited polysilicon material defines buried polysilicon source region 27. Following this, the mask layer is removed and a silicon dioxide layer is thermally grown on epitaxial layer 23 and in trench 22 to form first oxide layer 26A and third oxide layer 26C. Then, a polysilicon material is deposited and etched back to an upper surface of trench 22 such that the remaining polysilicon material in trench 22 above third oxide layer 26C defines polysilicon gate region 21. Next, a blanket ion implantation is performed to form body region 25 and a subsequent ion implantation is performed to form source region 24. This latter ion implantation is masked to ensure ion implantation is only carried out in an active area of the semiconductor region. These implantation steps also form drift region 23 as being the non-implanted region of epitaxial layer 23 and define a length of drift region 23 from a bottom of body region 25 to the substrate.

A drawback of the abovementioned known structure and process is the difficulty in properly aligning second oxide layer 26B and polysilicon buried source region 27 with respect to body region 25 and drift region 23. Through simulations, the Applicant has found that a high degree of process control is required to achieve full RESURF entitlement in terms of breakdown voltage of the device. In other words, the known device, when manufactured using the known manufacturing process, is particularly sensitive to process variations, and can therefore be unreliable in terms of breakdown voltage performance between multiple trench-MOSFET structures 20.

SUMMARY

It is an object of the present disclosure to provide a trench-gate semiconductor device, and method for manufacturing the same, for which the abovementioned problems are prevented or limited.

According to one aspect of the present disclosure, a trench-gate semiconductor device is provided. The semiconductor device comprises one or more unit cells arranged in a semiconductor region, each unit cell comprising a first trench, a second trench extending from a bottom of the first trench, a first oxide layer arranged on a first side wall of the first trench and forming a gate oxide of the unit cell, and a second oxide layer arranged on a second side wall and bottom of the second trench. Each unit cell further comprises a first polysilicon region arranged inside the first trench, separated from the first side wall by the first oxide layer, and forming a gate of the unit cell, a second polysilicon region arranged inside the second trench, separated from the second side wall and bottom of the second trench by the second oxide layer, and forming a buried source of the unit cell, and a third oxide layer arranged in between the first polysilicon region and the second polysilicon region.

By arranging a second trench at a well-defined depth in a bottom of the first trench, the buried polysilicon source region can be more accurately positioned with respect to the body region thereby improving the uniformity across multiple unit cells or even wafers. More in particular, the trench etch measure used to form the first trench can similarly be used to etch back the second polysilicon region, thereby achieving an accurately positioned second polysilicon region and third oxide layer with respect to the body region and the drift region. As a result, the device or unit cell according to the present disclosure is less sensitive to process variations.

Another drawback of the known device of FIG. 1 is related to the somewhat deteriorated leakage and breakdown behaviour of these devices when compared with simulations and/or theoretical predictions. The Applicant has found that these adverse effects can be attributed to the reliability of the oxide structure in the unit cell. More in particular, the Applicant has found that the known manufacturing process results in a device in which, at intersection region 28, the join between first through third oxide layers 26A-26C will generally exhibit discontinuities, which adversely impact device performance. More in particular, the Applicant has found that a poor, non-smooth join between first, second and third oxide layers 26A-26C is detrimental to the breakdown voltage performance of the device. Without being bound by theory, it is assumed that this can be attributed to the high electric field at intersection region 28 due to the non-uniform oxide thickness where first oxide layer 26A and second oxide layer 26B join. In addition, an increase in leakage current and a reduction of overall gate quality of the device is observed due to this poor join.

To this end, according to the present disclosure, each of the first, second and third oxide layers may be thermally grown, wherein the oxide layers jointly form a contiguous oxide region.

The Applicant has found that the poor join between the first through third oxide layers in the device shown in FIG. 1 occurs due to the fact that the second oxide layer is provided first using deposition, while the first and third oxide layers are thermally grown. Thus, if the first, second and third oxide layers are all thermally grown, a smoother join between these oxide layers can be achieved thereby avoiding or mitigating the abovementioned adverse effects.

The semiconductor region can be formed by a semiconductor substrate of a first charge type, and an epitaxial layer of the first charge type arranged on top of the semiconductor substrate, wherein a dopant concentration of the epitaxial layer is less than a dopant concentration of the semiconductor substrate. Furthermore, the first trench and the second trench can be arranged only in the epitaxial layer of the semiconductor region.

The third oxide layer can be arranged at or near a border between the first trench and the second trench. Similarly, the buried polysilicon source region may extend to a boundary between the first and second trench.

The one or more unit cells may further each comprise a body region of a second charge type different from the first charge type, wherein the body region is separated from the first polysilicon region by the first oxide layer. A bottom surface of the body region may be higher than a top surface of the third oxide layer to ensure proper thickness control of the first oxide layer. Additionally or alternatively, the one or more unit cells may each further comprise a source region of the first charge type, wherein the source region vertically extends from a top surface of the semiconductor body to the body region. Furthermore, a dopant concentration of the source region is preferably greater than that of the epitaxial layer, more preferably at least two orders of magnitude greater.

The doping in the epitaxial layer is typically 1e12 cm-2. A well-designed RESURF drift region should be able to support a drain potential in the region of 30V/micron. The body region is typically doped at 1e13 cm-2 and is about 1.2 micron long. The source region is typically 5e15 cm-2 and about 0.25 micron deep, as measured from the surface of the semiconductor region. Hence, a typical channel length is in the region of a micron but depends upon the breakdown voltage rating. High rating typically requires long channels due to the channel depletion from the drain. The distance from the end of the channel and bottom of the gate polysilicon region is typically around 0.2 microns.

Each unit cell may further comprise a moat region. The moat region electrically shorts the source and body regions to enable a good ohmic contact. The moat can be filled with a source metallization. In some embodiments that comprise a plurality of unit cells, the source metallization is applied to all the moat regions so that all unit cells are at the same source potential. The moat region can be arranged, preferably centrally, in between the first and second trench of the corresponding unit cell and a first and second trench of an adjacent unit cell. The moat region is spaced apart from the first and second trench of the corresponding unit cell and is formed by etching through the source region into the body region.

The one or more unit cells may further comprise a fourth oxide layer arranged on top of the first trench and the source region, and a fifth oxide layer arranged on top of the fourth oxide layer. It should be noted that other insulating materials could be used instead of the fourth and/or fifth oxide layers. Furthermore, the fifth oxide layer can be used as a mask for etching the moat region and the fourth oxide layer can be used to improve the ion implantation for the formation of the body region and source region.

The semiconductor device may further comprise a first metal layer, such as aluminium, arranged on one or more of the one or more unit cells of the semiconductor device, wherein the metal layer can be configured to provide a source contact for the one or more unit cells, to electrically contact the body region, and, optionally, to electrically connect the source region to the buried source. Furthermore, the semiconductor device may further comprise a metal contact arranged on top of the first polysilicon region of one or more of said one or more unit cells and configured to provide a gate contact for said one or more unit cells, wherein the metal contact is preferably arranged at or near an end of the one or more unit cells where the metal layer is absent.

Typically, the unit cells are elongated. Following the formation of the moat region, aluminium is deposited or sputtered and is masked and etched to form the source and gate metallization. The source metallization contact to the buried polysilicon source region is typically achieved at the end of the unit cell where the buried source polysilicon region extends to the top of the first trench. The gate metallization can contact the gate polysilicon region (typically) at the opposite side of the unit cell.

The one or more unit cells can be identical to one another. Preferably, the one or more unit cells are elongated having a length between 0.5 and 4.0 mm and a width between 0.6 and 2.0 micron. A typical semiconductor device may then comprise 100 or more of these unit cells arranged next to each other.

A depth of the first trench relative to a top surface of the semiconductor region may lie in a range between 0.5 and 2.0 microns, preferably between 1.0 and 1.5 microns, and/or a depth of the second trench relative to the bottom of the first trench may lie in a range between 0.2 and 2 microns, preferably between 0.4 and 1.0 microns.

The semiconductor region preferably comprises a silicon-based semiconductor region and/or the first oxide layer, the second oxide layer, and the third oxide layer may comprise thermally grown silicon dioxide. Moreover, the semiconductor device can be a trench-gate metal-oxide-semiconductor field-effect transistor, MOSFET.

According to another aspect of the present disclosure, a method for manufacturing a unit cell of the trench-gate semiconductor device described above is provided. The method comprises forming a first trench in the semiconductor region using a first mask layer, providing a first oxide layer on a first side wall and bottom of the first trench, the first oxide layer on the first side wall forming a gate oxide of the unit cell. The method further comprises depositing a second mask layer inside the first trench and etching, preferably using dry-etching, the second mask layer to expose the underlying semiconductor region at a bottom of the first trench while the second mask keeps covering the first oxide layer on the side wall of the first trench at least to a large extent. The method additionally comprises forming a second trench using the etched second mask layer. The second trench thus formed extends from the bottom of the first trench. The method further comprises providing a second oxide layer on a side wall and bottom of the second trench with the etched second mask layer still at least partially in place, depositing a second polysilicon layer on the second oxide layer in the second trench, said second polysilicon layer forming a buried source of the unit cell. The method also comprises providing a third oxide layer on top of the second polysilicon layer, removing the second mask layer, and depositing a first polysilicon layer on the third oxide layer and first oxide layer, said first polysilicon layer forming a gate of the unit cell.

Providing the first, second and third oxide layers may comprise thermally growing said first, second and third oxide layers, wherein said first, second and third oxide layers jointly form a contiguous oxide region.

The method may further comprise, prior to thermally growing the third oxide layer, etching a part of the etched second mask layer at or near a bottom of the first trench. The partial etch of the etched second mask improves the join between the first, second, and third oxide layers. More in particular, the Applicant has found that the thermal growth of the second oxide layer deforms the second mask layer that is arranged next to the first oxide layer. This deformation, e.g. an inwardly oriented curvature, may deteriorate the join between the first, second, and third oxide layers. This deformation can however be removed by performing an etching step, e.g. a dry-etching step, prior to thermally growing the third oxide layer.

The semiconductor region may comprise an epitaxial layer of a first charge type arranged on top of a semiconductor substrate of the first charge type, wherein a dopant concentration of the epitaxial layer region is less than a dopant concentration of the semiconductor substrate. The first trench and the second trench are preferably formed only in the epitaxial layer of the semiconductor region.

Forming the first trench may further comprise depositing and patterning a first mask layer and forming the first trench using the patterned first mask layer.

The method may further comprise depositing a fourth oxide layer, forming a body region in the semiconductor region by implanting dopants of a second charge type different from the first charge type through the fourth oxide layer, wherein the body region is separated from the first polysilicon region by the first oxide layer, and forming a source region in the semiconductor body by implanting dopants of the first charge type through the fourth oxide layer, wherein the source region vertically extends from a top surface of the semiconductor body to the body region.

A bottom surface of the body region can be higher than a top surface of the third oxide layer and/or a bottom surface of the first polysilicon region can be lower than the bottom surface of the body region.

The method may further comprise depositing and patterning a fifth oxide layer on top of the fourth oxide. The method may additionally comprise forming, using the fifth oxide layer as a mask, a moat region in the semiconductor body. More in particular, those parts of the semiconductor region that are not covered by the fifth oxide layer are etched into the body region.

The method may further comprise providing a metal layer on top of one or more of said one or more unit cells, wherein the metal layer is configured to provide a source contact for the unit cell, to electrically contact the body region, and to optionally electrically connect the source region to the buried source. Additionally, the method may further comprise forming a metal contact on top of the first polysilicon region for providing a gate contact for the unit cell, wherein the metal contact is preferably formed at or near an end of the unit cell where the metal layer is absent.

A plurality of unit cells can be formed simultaneously by performing the method, wherein the unit cells are preferably identical to each other.

A depth of the first trench relative to a top surface of the semiconductor region may lie in a range between 0.5 and 2.0 microns, preferably between 1.0 and 1.5 microns, and/or a depth of the second trench relative to the bottom of the first trench may lie in a range between 0.2 and 2 microns, preferably between 0.4 and 1.0 microns.

The semiconductor region is preferably a silicon-based semiconductor region. At least one of the first mask layer and the second mask layer may comprise silicon nitride or oxide nitride oxide, 'ONO'.

The trench-gate semiconductor device may be a trench-gate metal-oxide-semiconductor field-effect transistor, MOSFET.

BRIEF DESCRIPTION OF THE DRAWINGS

Next, the present disclosure will be described with reference to the appended drawings, wherein.

Hereinafter, reference will be made to the appended drawings. It should be noted that identical reference signs may be used to refer to identical or similar components. Furthermore, the unit cells depicted in FIG. 1 and FIGS. 2A-2H are symmetric along the vertical axis in these figures. For illustrative purposes, only half of the unit cell is therefore illustrated.

DETAILED DESCRIPTION

FIGS. 2A-2H illustrate the process of the first part of manufacturing a unit cell 1 of a trench-gate semiconductor device 100 in which a silicon semiconductor region is used. Remaining process steps will be described with reference to FIG. 3. It is noted that this process can be used to manufacture individual unit cells separately, or to manufacture multiple unit cells simultaneously on a same semiconductor region.

Figure 1:
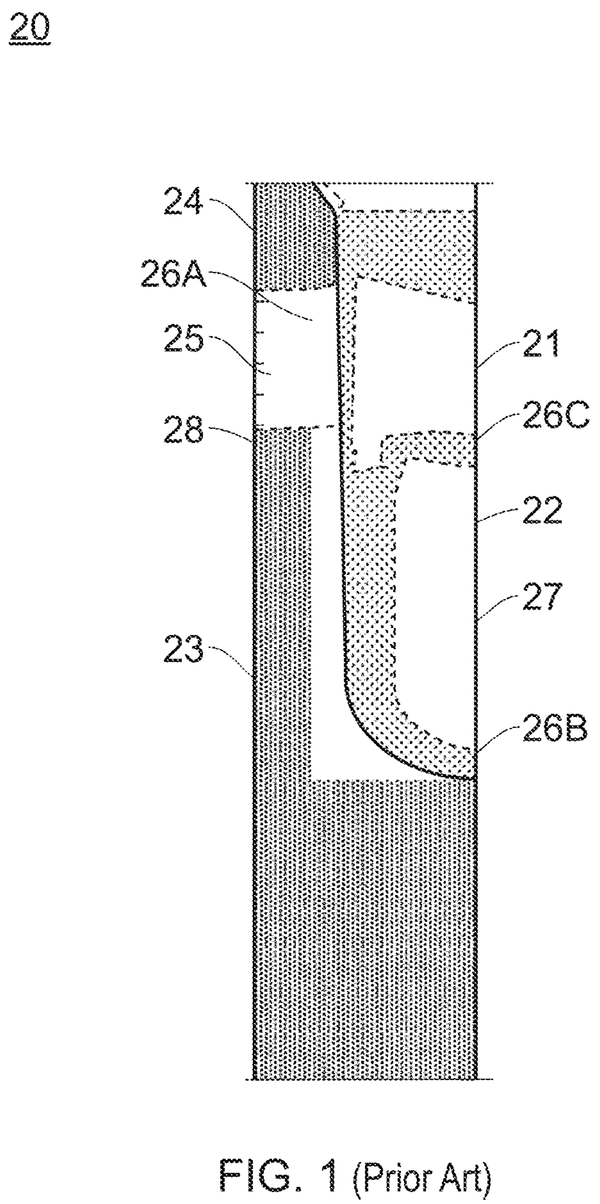
FIG. 1 (Prior Art)
FIG. 1 is a cross-sectional view of a trench-MOSFET known from the prior Art.
Figure 2A:
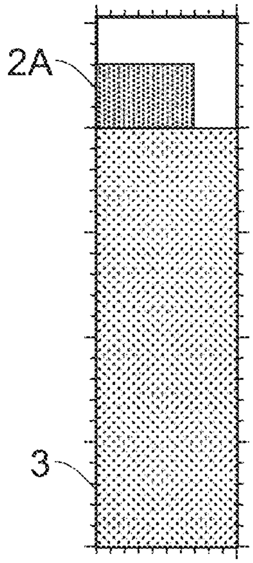
FIGS. 2A-2H are cross-sectional views of a unit cell of a trench-gate semiconductor device at various processing steps according to some embodiments of the present disclosure.

Referring to FIG. 2A, a first mask layer 2A is deposited and patterned onto a surface of a semiconductor region. For example, first mask layer 2A is provided on top of an epitaxial layer 3 arranged on top of a semiconductor substrate (not shown). First mask layer 2A is patterned such that a portion of the semiconductor region where trench 4A is to be provided is exposed, while a remaining portion of the semiconductor body is covered. For example, silicon nitride or oxide nitride oxide (ONO) can be used for first mask layer 2A.

Figure 2B:
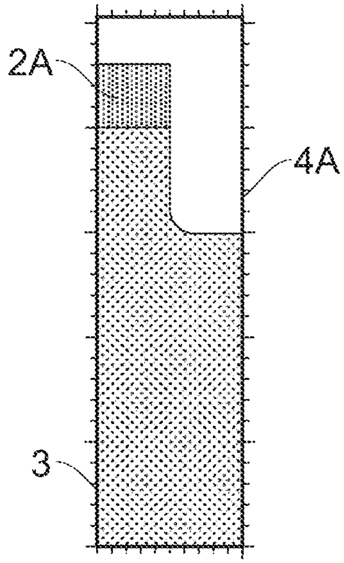

Referring to FIG. 2B, first trench 4A is then formed by etching back the exposed part of the semiconductor region (e.g. epitaxial layer 3). For example, first trench 4A may have a depth in the range between 1.0 microns and 1.5 microns. However, the depth of first trench 4A is not limited thereto, and may depend on the desired breakdown voltage rating or the required channel length of semiconductor device 100.

Figure 2C:
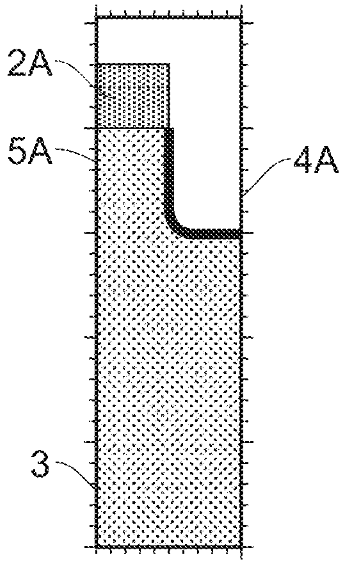

Referring to FIG. 2C, after having formed first trench 4A, a first oxide layer 5A is provided on a side wall and bottom of first trench 4A. A portion of first oxide layer 5A on the side wall of first trench 4A will eventually form the gate oxide of semiconductor device 100. For example, first oxide layer 5A is thermally grown onto the side wall and bottom of first trench 4A. An optimal thickness of first oxide layer 5A may depend on the application for which semiconductor device 100 will be used. The present disclosure is particularly applicable for trench-MOSFETs operable in a frequency range between DC and 500 kHz and handling a current between 5 A per $mm^2$. For such devices, first oxide layer 5A generally has a thickness matching a given voltage rating.

Figure 2D:
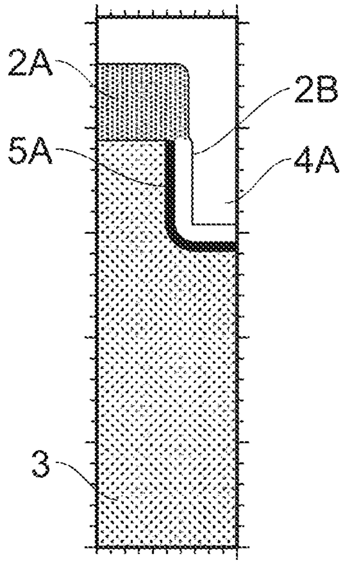

Referring to FIG. 2D, after having provided first oxide layer 5A, a second mask layer 2B is deposited, in particular onto first oxide layer 5A on the bottom and side wall of first trench 5A.

Figure 2E:
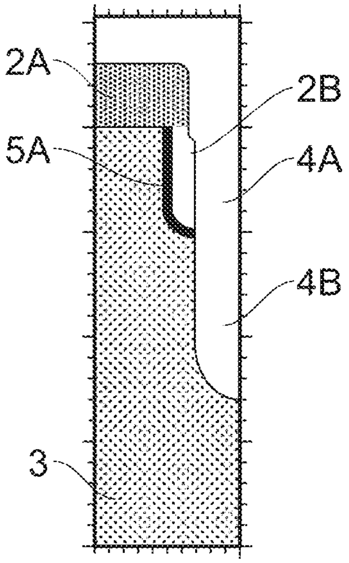

Referring to FIG. 2E, second mask layer 2B is dry-etched, thereby exposing first oxide layer 5A at the bottom of first trench 4A while covering first oxide layer 5A on the side wall of first trench 4A. Then, the exposed first oxide layer 5A is dry-etched to expose the semiconductor region underneath. Thereafter, a second trench 4B is etched into the semiconductor region (e.g. epitaxial layer 3) extending from the bottom of first trench 4A and using etched second mask layer 2B as a protective mask, that is, second mask layer 2B defines a trench mask for second trench 4B. Second trench 4B may serve as a basis for a RESURF structure. Second trench 4B may have a depth between 0.4 and 1.0 microns, such as 0.6 microns.

Figure 2F:
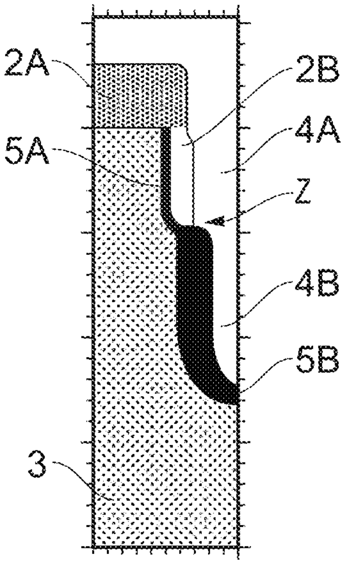

Referring to FIG. 2F, a second oxide layer 5B is provided on a second side wall and bottom of second trench 4B. In particular, second oxide layer 5B is provided with the patterned second mask layer 2B still at least partially in place. For example, second oxide layer 5B is thermally grown onto a second side wall and bottom of second trench 4B.

Figure 2G:
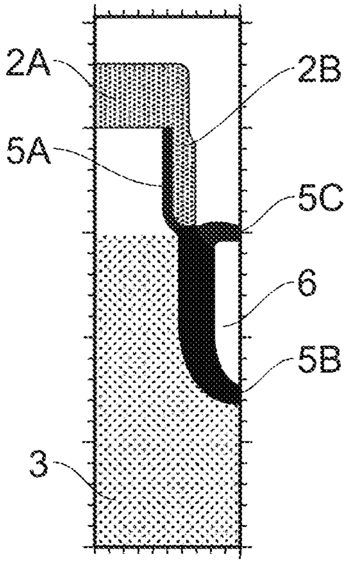

Referring to FIG. 2G, polysilicon material is deposited onto second oxide layer 5B. After having deposited the polysilicon material, the polysilicon material is etched back, for example until a bottom of second mask layer 2B on the first side wall of first trench is exposed. In other words, the polysilicon material is etched back to a border between first and second trenches 4A and 4B, and the remaining polysilicon material forms second polysilicon region 6, which forms a buried source of unit cell 1. Then, a third oxide layer 5C is provided on top of second polysilicon region 6 which joins with first and second oxide layers 5A and 5B to form a contiguous oxide region. Optionally, a portion of second mask layer 2B is additionally etched prior to providing third oxide layer 5C, to ensure a smooth join between the oxide layers 5A-5C. As an example, third oxide layer is thermally grown onto second polysilicon region 4B.

The Applicant has found that by thermally growing second oxide layer 5B, already arranged second mask layer 2B may deform. This is illustrated using arrow Z in FIG. 2F. More in particular, second mask layer 2B may extend inward. This inwardly oriented portion of second mask layer 2B can be removed using a dry-etching technique prior to thermally growing third oxide layer 5C. In this manner, the join between oxide layers 5A-5C may be improved.

Figure 2H:
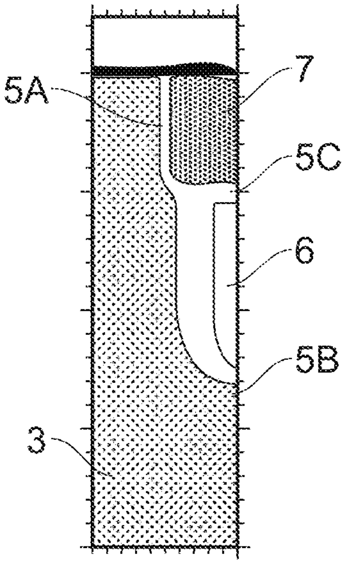

Referring to FIG. 2H, polysilicon material is deposited onto third oxide layer 5C and first oxide layer 5A and is etched back to a top surface of the semiconductor region. The remaining polysilicon material forms a first polysilicon region 7, which forms a gate of unit cell 1.

Figure 3:
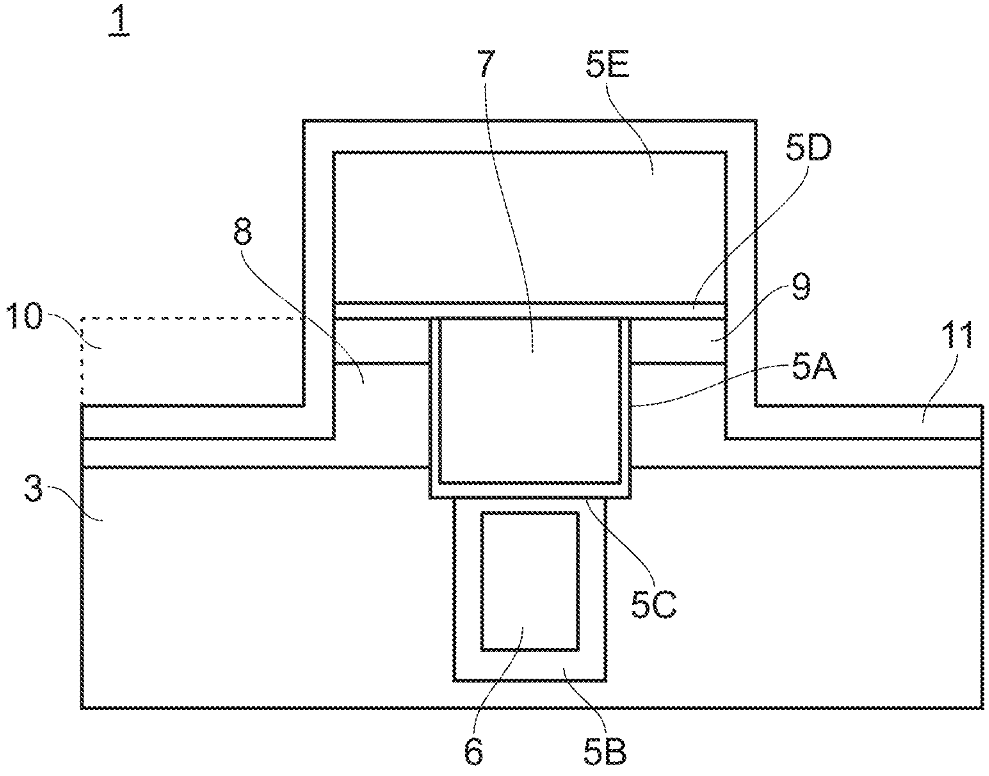
FIG. 3 is a cross-sectional view of a unit cell of a trench-gate semiconductor device according to an embodiment of the present disclosure.

FIG. 3 shows a cross-sectional view of a completed unit cell 1. After first trench 4A and second trench 4B are filled with polysilicon and oxide layers, a fourth oxide layer can optionally be provided on top of the semiconductor region. Although not required, fourth oxide layer 5D may be beneficial during dopant implantation into the semiconductor region, as fourth oxide layer 5D prevents or limits channelling of the dopants and increases implantation uniformity in the implanted regions.

A body region 8 is implanted with dopants of a second charge type different from the first charge type, optionally through fourth oxide layer 5D, using for example a blanket implantation technique. Then, a source region 9 is implanted with dopants of the first charge type, optionally through fourth oxide layer 5D. In particular, body region 8 may be formed laterally adjacent to first polysilicon region 7 and may be separated from first polysilicon region 7 by first oxide layer 5A. Source region 9 may extend from a top surface of the semiconductor region to body region 8. For example, source region 9 is implanted into the body of the device and is typically 0.2 microns deep in a body region that is typically 1.2 microns deep.

A fifth oxide layer 5E is then deposited on fourth oxide layer 5D and is subsequently patterned. Then, a moat region 10 can be etched into the semiconductor region into body region 8, wherein fifth oxide layer 5E serves as a protective mask to prevent etching of the trench structure, source region 9 and body region 8. Moat region 10 is configured to provide an electrical contact to source region 9 and body region 8.

Then, a metal layer 11 is provided on top of unit cell 1 and other unit cells in semiconductor device 100. Metal layer 11 provides a single contact to one or more source regions 9 of one or more unit cells 1 in semiconductor device 100. Fifth oxide layer 5E isolates the trench structure from metal layer 11. Prior to providing metal layer 11, an ion implant may be used to improve the Ohmic contact between metal layer 11 and body region 8.

Figure 4:
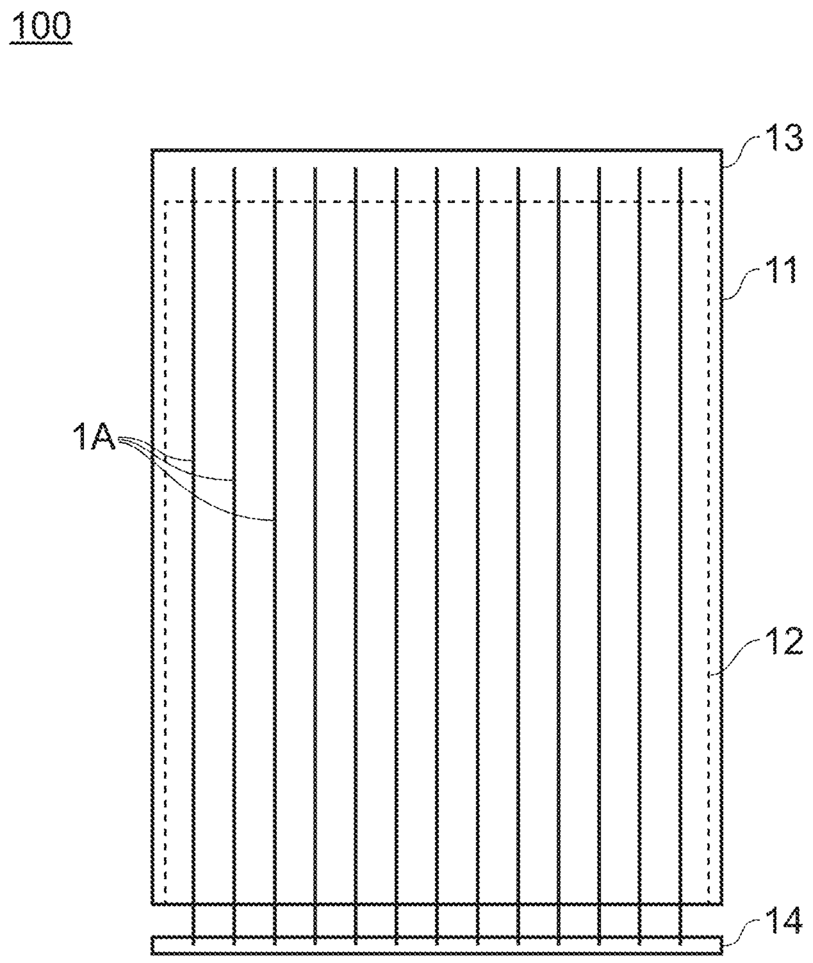
FIG. 4 is a simplified top view of a trench-gate semiconductor device having a plurality of unit cells according to an embodiment of the present disclosure.

FIG. 4 shows a simplified top view of semiconductor device 100 comprising a plurality of unit cells. Of these unit cells, a metal layer 11 is illustrated that extends over an active region 12.

First trenches 4A and second trenches 4B jointly form a trench stripe that extends over and beyond active area 12. Metal layer 11 also contacts the buried polysilicon source region at the end 13 of the trench stripe outside active area 12 where the polysilicon was masked to stop it from being etched during formation of the second polysilicon region 6 as was illustrated in FIG. 2G. The contact to source region 9 is defined at the same stage as patterning oxide 5E in the unit cell. The patterned gate metallization 14 contacts first polysilicon region 7 of multiple unit cells at the opposite ends of the trench stripes. This contact to first polysilicon regions 7 is also defined at the same stage as patterning oxide 5E in the unit cell.

In the above embodiments, the first charge type may refer to an n-type, and the second charge type may refer to a p-type, or vice versa.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. A trench-gate semiconductor device, the semiconductor device comprising one or more unit cells arranged in a semiconductor region, wherein each unit cell comprises:

the semiconductor region formed by a semiconductor substrate of a first charge type;

an epitaxial layer of the first charge type arranged on top of the semiconductor substrate;

a body region of a second charge type different from the first charge type;

a first trench;

a second trench extending from a bottom of the first trench, wherein the second trench is narrower than the first trench;

a first oxide layer arranged on a first side wall of the first trench and forming a gate oxide of a unit cell of the one or more unit cells;

a second oxide layer arranged on a second side wall and a bottom of the second trench so that the second trench including the second oxide layer is narrower than the first trench including the first oxide layer;

a first polysilicon region arranged inside the first trench, separated from the first side wall by the first oxide layer, and forming a gate of the unit cell, wherein the body region is separated from the first polysilicon region by the first oxide layer;

a second polysilicon region arranged inside the second trench, separated from the second side wall and the bottom of the second trench by the second oxide layer, and forming a buried source of the unit cell; and a third oxide layer arranged in between the first polysilicon region and the second polysilicon region to form a contiguous oxide region, wherein the body region has a bottom surface that is spaced higher than an entire top surface of the contiguous oxide region where the third oxide layer joins with the first oxide layer arranged vertically on the first side wall.

2. The semiconductor device according to claim 1, wherein each of the first oxide layer, second oxide layer and third oxide layer is thermally grown, and wherein each of the first oxide layer, second oxide layer and third oxide layer jointly form a contiguous oxide region.

3. The semiconductor device according to claim 1, wherein the semiconductor region is formed by the semiconductor substrate of the first charge type, and the epitaxial layer of the first charge type arranged on top of the semiconductor substrate;

wherein the epitaxial layer has a dopant concentration that is less than a dopant concentration of the semiconductor substrate;

wherein the first trench and the second trench are arranged only in the epitaxial layer of the semiconductor region; and wherein the third oxide layer is arranged at or near a border between the first trench and the second trench.

4. The semiconductor device according to claim 1, wherein the one or more unit cells further comprise a source region of the first charge type; wherein the source region vertically extends from a top surface of the semiconductor region to the body region;

wherein the dopant concentration of the source region is greater than that of the epitaxial layer;

wherein each unit cell of the one or more unit cells further comprises a moat region arranged, centrally, in between the first and second trench of a corresponding unit cell and a first and second trench of an adjacent unit cell;

wherein the moat region is spaced apart from the first and second trench of the corresponding unit cell; and wherein the moat region is formed by an etch through the source region into the body region.

5. The semiconductor device according to claim 1, wherein the one or more unit cells further comprise a fourth oxide layer arranged on top of the first trench and a source region, and a fifth oxide layer arranged on top of the fourth oxide layer.

6. The semiconductor device according to claim 1, wherein the one or more unit cells are identical to one another;

wherein the first trench has a depth that relative to a top surface of the semiconductor region lies in a range between 0.5 and 2.0 microns;

wherein the second trench has a depth that relative to the bottom of the first trench lies in a range between 0.2 and 2.0 microns;

wherein the body region comprises a silicon-based semiconductor body;

wherein the first oxide layer, the second oxide layer and the third oxide layer comprise thermally grown silicon dioxide; and wherein the semiconductor device is a trench-gate metal-oxide-semiconductor field-effect transistor, MOSFET.

7. The semiconductor device according to claim 6, wherein the semiconductor device further comprises a metal layer arranged on top of at least one of the one or more unit cells of the semiconductor device;

wherein the metal layer is configured to provide a source contact for the one or more unit cells, to electrically contact the body region, and to electrically connect a source region to the buried source;

wherein the semiconductor device further comprises a metal contact arranged on top of the first polysilicon region of at least one of the one or more unit cells and configured to provide a gate contact for the one or more unit cells; and wherein the metal contact is arranged at or near an end of the one or more unit cells where the metal layer is absent.

8. A method for manufacturing a unit cell of the trench-gate semiconductor device according to claim 1, comprising:

forming a first trench in the semiconductor region, wherein the semiconductor region comprises an epitaxial layer of a first charge type arranged on top of a semiconductor substrate of the first charge type;

providing a first oxide layer on a first side wall and bottom of the first trench, the first oxide layer on the first side wall forming a gate oxide of the unit cell;

depositing a second mask layer inside the first trench and etching the second mask layer to expose the underlying semiconductor region at a bottom of the first trench while the second mask keeps covering the first oxide layer on the first side wall of the first trench;

forming a second trench using the etched second mask layer, the second trench extending from the bottom of the first trench, wherein the second trench is narrower than the first trench;

providing a second oxide layer on a second side wall and bottom of the second trench with the etched second mask layer still at least partially in place so that the second trench including the second oxide layer is narrower than the first trench including the first oxide layer;

depositing a second polysilicon layer on the second oxide layer in the second trench, the second polysilicon layer forming a buried source of the unit cell;

providing a third oxide layer on top of the second polysilicon layer;

removing the second mask layer;

depositing a first polysilicon layer on the third oxide layer and first oxide layer, the first polysilicon layer forming a gate of the unit cell; and forming a body region in the semiconductor region by implanting dopants of a second charge type different from the first charge type;

wherein the body region is separated from the first polysilicon region by the first oxide layer, and wherein the body region has a bottom surface that is spaced higher than a top surface of the third oxide layer.

9. The method according to claim 8, wherein providing the first oxide layer, second oxide layer and third oxide layer comprises thermally growing the first oxide layer, the second oxide layer and the third oxide layer;

wherein the first oxide layer, the second oxide layer and the third oxide layer jointly form a contiguous oxide region; and wherein the method further comprises, prior to thermally growing the third oxide layer, etching a part of the etched second mask layer at or near a bottom of the first trench.

10. The method according to claim 8, wherein the epitaxial layer has a dopant concentration that is less than a dopant concentration of the semiconductor substrate; and wherein the first trench and the second trench are formed only in the epitaxial layer of the semiconductor region; and/or wherein forming the first trench further comprises depositing and patterning a first mask layer; and forming the first trench using the patterned first mask layer.

11. The method according to claim 8, wherein the method further comprises:

depositing a fourth oxide layer;

forming the body region in the semiconductor region by implanting the dopants of the second charge type through the fourth oxide layer;

forming a source region in the semiconductor region by implanting dopants of the first charge type through the fourth oxide layer; wherein the source region vertically extends from a top surface of the semiconductor region to the body region; and wherein the first polysilicon region has a bottom surface that is lower than the bottom surface of the body region.

12. The method according to claim 11, wherein the method further comprises:

depositing and patterning a fifth oxide layer on top of the fourth oxide layer, wherein the method further comprises:

using the fifth oxide layer as a mask, and forming a moat region in the semiconductor region.

13. The method according to claim 8, wherein the method further comprises:

providing a metal layer on top of at least one of the one or more unit cells;

wherein the metal layer is configured to provide a source contact for the one or more the unit cells to electrically contact the body region and to electrically connect a source region to the buried source; and wherein the method further comprises:

forming a metal contact on top of the first polysilicon region for providing a gate contact for the unit cell;

wherein the metal contact is formed at or near an end of the unit cell where the metal layer is absent.

14. The method according to claim 8, wherein a plurality of unit cells are formed simultaneously by performing the method;

wherein the unit cells are identical to each other;

wherein the first trench has a depth that relative to a top surface of the semiconductor region lies in a range between 0.5 and 2.0 microns;

wherein the second trench has a depth that relative to the bottom of the first trench lies in a range between 0.2 and 2.0 microns;

wherein the first and second trench are formed in the semiconductor region;

wherein at least one of a first mask layer and the second mask layer comprise silicon nitride or oxide nitride oxide, 'ONO'; and/or wherein the trench-gate semiconductor device is a trench-gate metal-oxide-semiconductor field-effect transistor, MOSFET.

15. The method according to claim 9, wherein the epitaxial layer has a dopant concentration that is less than a dopant concentration of the semiconductor substrate;

wherein the first trench and the second trench are formed only in the epitaxial layer of the semiconductor region;

wherein forming the first trench further comprises:

depositing and patterning a first mask layer; and forming the first trench using the patterned first mask layer.

16. The method according to claim 9, wherein the method further comprises:

depositing a fourth oxide layer;

forming the body region in the semiconductor region by implanting dopants of the second charge type through the fourth oxide layer;

forming a source region in the semiconductor region by implanting dopants of the first charge type through the fourth oxide layer;

wherein the source region vertically extends from a top surface of the semiconductor region to the body region; and wherein the first polysilicon region has a bottom surface that is lower than the bottom surface of the body region.

17. The method according to claim 10, wherein the method further comprises:

depositing a fourth oxide layer;

forming the body region in the semiconductor region by implanting dopants of the second charge type through the fourth oxide layer; and forming a source region in the semiconductor region by implanting dopants of the first charge type through the fourth oxide layer; wherein the source region vertically extends from a top surface of the semiconductor region to the body region; and wherein the first polysilicon region has a bottom surface that is lower than the bottom surface of the body region.

* * * * *